United States Patent
Lee et al.

(10) Patent No.: US 9,263,578 B2
(45) Date of Patent: Feb. 16, 2016

(54) SEMICONDUCTOR SUBSTRUCTURE HAVING ELEVATED STRAIN MATERIAL-SIDEWALL INTERFACE AND METHOD OF MAKING THE SAME

(71) Applicant: TAIWAN SEMICONDUCTOR MANUFACTURING CO., LTD., Hsin-Chu (TW)

(72) Inventors: Wei-Yang Lee, Taipei (TW); Yuan-Ching Peng, Hsinchu (TW); Chun-Hsiung Tsai, Xinpu Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/697,656

(22) Filed: Apr. 28, 2015

(65) Prior Publication Data
US 2015/0228791 A1 Aug. 13, 2015

Related U.S. Application Data

(63) Continuation of application No. 13/739,010, filed on Jan. 11, 2013, now Pat. No. 9,029,912.

(51) Int. Cl.
| H01L 29/66 | (2006.01) |
| H01L 29/78 | (2006.01) |
| H01L 29/165 | (2006.01) |
| H01L 21/02 | (2006.01) |
| H01L 21/306 | (2006.01) |
| H01L 29/161 | (2006.01) |

(52) U.S. Cl.
CPC ...... *H01L 29/7848* (2013.01); *H01L 21/02532* (2013.01); *H01L 21/30604* (2013.01); *H01L 29/161* (2013.01); *H01L 29/165* (2013.01); *H01L 29/6653* (2013.01); *H01L 29/6656* (2013.01); *H01L 29/66431* (2013.01); *H01L 29/66545* (2013.01); *H01L 29/66628* (2013.01); *H01L 29/66636* (2013.01); *H01L 29/78* (2013.01)

(58) Field of Classification Search
None
See application file for complete search history.

(56) References Cited

U.S. PATENT DOCUMENTS

| 7,358,551 B2 | 4/2008 | Chidambarrao et al. |
| 7,652,332 B2 | 1/2010 | Cartier et al. |
| 7,833,852 B2 * | 11/2010 | Winstead et al. ............. 438/197 |
| 8,008,157 B2 | 8/2011 | Liang et al. |
| 8,278,166 B2 | 10/2012 | Chen et al. |
| 2009/0039390 A1 * | 2/2009 | Murthy et al. .... H01L 21/02381 257/190 |
| 2011/0079820 A1 | 4/2011 | Lai et al. |
| 2011/0121363 A1 | 5/2011 | Cheng et al. |

* cited by examiner

*Primary Examiner* — Sonya D McCall Shepard
(74) *Attorney, Agent, or Firm* — Duane Morris LLP

(57) ABSTRACT

A semiconductor substructure with improved performance and a method of forming the same is described. In one embodiment, the semiconductor substructure includes a substrate, having an upper surface; a gate structure formed over the substrate; a spacer formed along a sidewall of the gate structure; and a source/drain structure disposed adjacent the gate structure. The source/drain structures is formed of a strain material and is disposed in an recess that extends below the upper surface of the substrate. An interface between the spacer and the source-drain structure can be at least 2 nm above the upper surface of the substrate.

20 Claims, 6 Drawing Sheets

SEMICONDUCTOR SUBSTRUCTURE HAVING ELEVATED STRAIN MATERIAL-SIDEWALL INTERFACE AND METHOD OF MAKING THE SAME

CROSS-REFERENCE TO RELATED APPLICATIONS

This application is a continuation application of U.S. patent application Ser. No. 13/739,010, filed Jan. 11, 2013, the entirety of which is incorporated by reference herein in its entirety.

TECHNICAL FIELD

The disclosure relates to semiconductor substructures and methods for manufacturing the same. More particularly, the disclosure relates to semiconductor substructures, such as those including PMOS transistors, with improved device performance due to source/drain structures for producing enhanced strain and methods of making the same.

BACKGROUND

P-type metal oxide semiconductor transistor (PMOS) devices are utilized throughout the electronics industry. Source/drain regions of transistors are generally formed in the substrate over which the transistor gate is formed. The source-drain structures can be formed of a strain inducing material in order to introduce strain in the channel region of the transistor. PMOS performance is enhanced by applying compressive strain to the channel, whereas NMOS performance is improved by tensile strain. The increased strain is known to improve device performance and device speed.

One method for applying compressive strain involves epitaxial growth of silicon on top of a silicon-germanium underlayer in the source-drain regions. The lattice of the silicon layer is stretched to follow the larger lattice constant of the underlying silicon-germanium. This causes compression of the channel.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure provides for forming improved PMOS devices, such as metal-oxide-semiconductor field-effect transistors (MOSFETs). The disclosure provides for forming systems with increased strain by producing a strain material-sidewall interface that extends above the upper surface of the substrate. An overview of the method used to form various PMOS devices according to the disclosure is provided in FIG. 1. Further details of the method and structures formed according to the methods are provided in conjunction with the subsequent figures.

Figure 1:
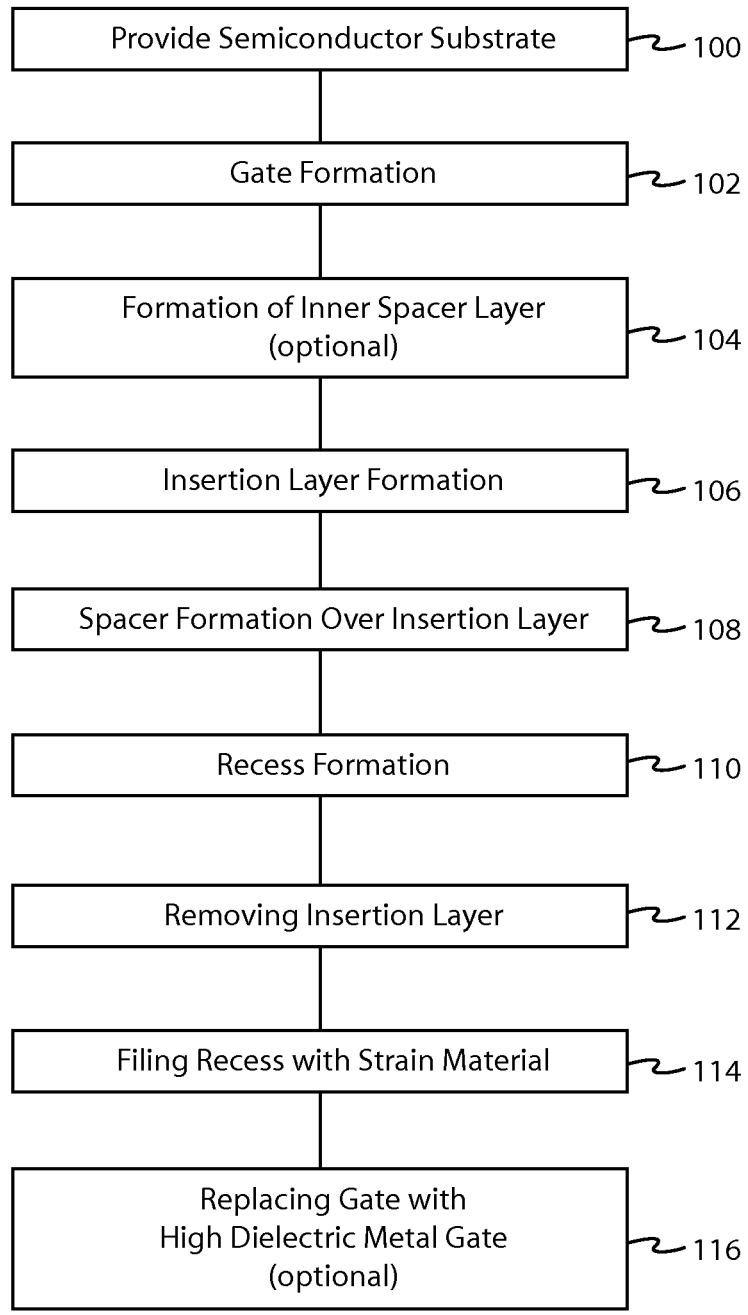
FIG. 1 is a flowchart for forming PMOS substructures in accordance with some embodiments.

In accordance with some embodiments, FIG. 1 is a flowchart describing a broad method for carrying out the formation of a semiconductor substructure (e.g., a PMOS transistor) embodiment. At step 100, a semiconductor substrate is provided. The semiconductor substrate can be silicon, such as crystalline silicon, silicon on insulator (SOI), or another suitable semiconductor material. Step 102 provides for the formation of a gate structure. Step 104, is an optional step, and provides for the formation of an inner spacer layer along the sides of the gate structure, for providing a lightly doped drain (LDD) region adjacent the channel. Step 106 provides for the formation of an insertion layer on either side of the gate structure. Step 108 provides for the formation of spacers along sidewalls of the gate structure. Step 110 provides for etching through the semiconductor material to form recesses adjacent to the gate structure that extend under at least a portion of the spacer. Step 112 provides for etching of the insertion layer from under the spacers. Step 114 provides for in-situ filling of the recesses with strain inducing material to form the source-drain structure. Because the insertion layer 10 has been removed, the interface between the strain inducing material and the source/drain spacer will be above the upper surface of the semiconductor substrate 2. Step 116, is an optional step, that provides for removing the gate structure, e.g., a polysilicon gate, and replacing it with a high-k dielectric metal gate structure. Additional details of this process will be evident from the following discussion of FIGS. 2-11.

Figure 2:
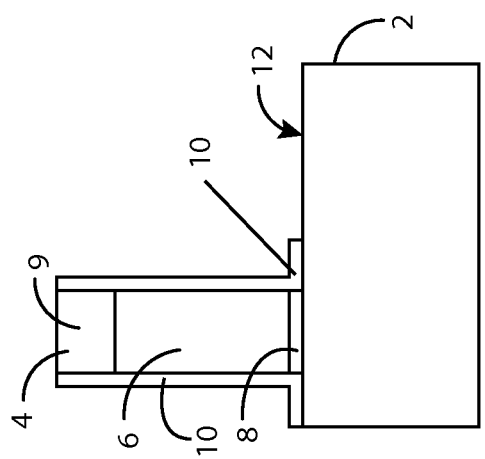
FIG. 2 is a cross-sectional view showing an intermediate structure following deposition of the insertion layer during formation of substructures in accordance with some embodiments.

FIG. 2 is a cross-sectional view of an intermediate step in the formation of an exemplary PMOS transistor embodiment after insertion layer formation 106. Substrate 2 is silicon (e.g., single crystal silicon, polycrystalline silicon or amorphous silicon) in one embodiment and substrate 2 is formed of other suitable materials in other embodiments. A native oxide layer can be present on the surface of the substrate 2. Native oxide layers are typically <10 Å (1 nm) in thickness.

Gate structure 4 is formed over substrate 2. The gate structure 4 can include a gate electrode 6 and a gate insulation layer (e.g., oxide) 8, which can be present between gate electrode 6 and the substrate 2. The gate insulation layer 8 can be deposited on or over the substrate 2 or can be a native oxide that has formed on the substrate 2. A hard mask 9 can be deposited over the gate electrode 6 to protect the gate electrode 6 during subsequent processing (e.g., etching or polishing) steps. The gate electrode 6 can be polycrystalline silicon in one embodiment and can be formed of other suitable materials in other embodiments. The gate electrode 6 can be doped in some embodiments and undoped in other embodiments. The gate insulation layer 8 can be silicon dioxide in one embodiment or can be formed of other suitable materials (e.g., high-κ materials) in other embodiments.

Figure 6:
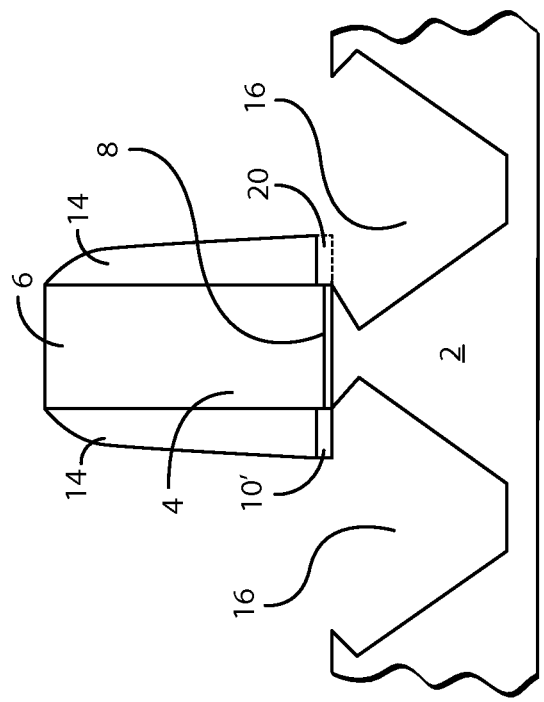
FIG. 6 is a cross-sectional view showing an embodiment with an intermediate structure similar to that of FIG. 4, where the gate structure includes a native oxide as the gate oxide and does not include an insertion layer along the side thereof.

An insertion layer 10, sometimes referred to in the art as a "seal layer," can extend laterally away from the gate structure 4 over an upper surface 12 of the substrate 2. The insertion layer 10 can be on the upper surface 12 of substrate 2. The insertion layer 10 can be L-shaped, as shown in FIG. 2, or linear on the upper surface 12, as shown in FIG. 6. The insertion layer 10 can be an oxide (e.g., silicon dioxide) in one embodiment or any other suitable material in other embodiments. The insertion layer 10 can be at least 10 Å (1 nm) thick in one embodiment and at least 20 Å (2 nm) thick in another embodiment. The insertion layer 10 can range from 10 to 30 Å (1-3 nm) in one embodiment and from 20-30 Å (2-3 nm) in another embodiment. This range is generally sufficient to produce a benefit, while enabling removal of the insertion layer 10 using the pre-cleaning step 110 described below.

Figure 3:
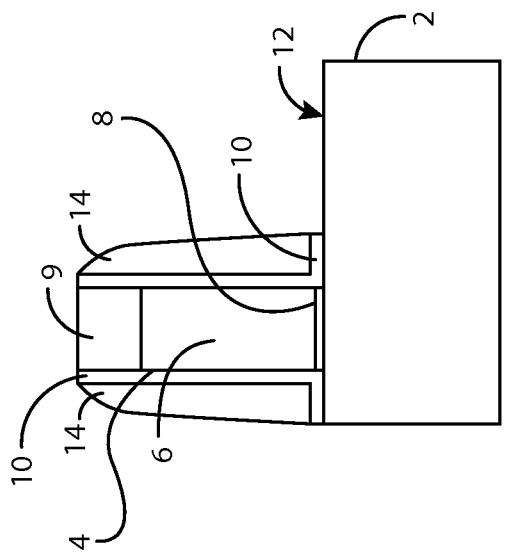
FIG. 3 is a cross-sectional view showing an intermediate structure following deposition of the spacers during formation of substructures in accordance with some embodiments.

FIG. 3 is a cross-sectional view of an intermediate step in the formation of an exemplary PMOS transistor embodiment after spacer formation 108. The spacer 14 is formed over the insertion layer 10 along a sidewall of the gate structure 4. As shown in FIG. 3, in some embodiments the insertion layer 10 can be between the spacer 14 and the gate electrode 6. Alternately, as shown in FIG. 6, the spacer 14 can directly contact the gate electrode 6 in other embodiments (i.e., a single-layer sidewall spacer structure). The spacer 14 can be a nitride (e.g., silicon nitride, silicon carbon nitride) in one embodiment or any other suitable material in other embodiments.

Figure 4:
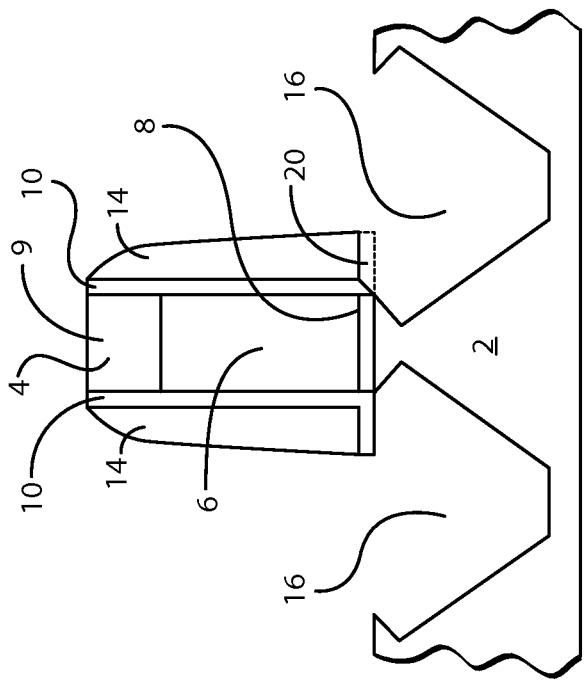
FIG. 4 is a cross-sectional view showing an intermediate structure following formation of the recess during formation of substructures in accordance with some embodiments.

FIG. 4 is a cross-sectional view of an intermediate step in the formation of an exemplary PMOS transistor embodiment after recess creation 110. The recess 16 is formed adjacent to the gate structure 4. The recess 16 is formed in the substrate 2 and can extend under at least a portion of the insertion layer 10. The recess 16 can also extend under at least a portion of the spacer 14. The recess 16 can extend under the entire insertion layer 10, the entire spacer 14, or both.

The process for forming the recess 16 can be isotropic or anisotropic. The recess 16 can be formed using wet or dry etching or other suitable techniques. The technique used to create the recess 16 can selectively remove the substrate 2 relative to the insertion layer 10, the spacer layer 14, or both. If the technique is an etching technique, the etchant can be tetramethylammonium hydroxide (TMAH) or other suitable etchants. TMAH can be used to create anisotropic recesses in silicon substrates. For example, TMAH could be used to form the shaped recess 16 shown in FIG. 4. Although FIGS. 4 and 5 show embodiments where the recesses are diamond shaped for ease of illustration, one of ordinary skill understands that the corners of the recess 16 can be rounded.

Figure 5:
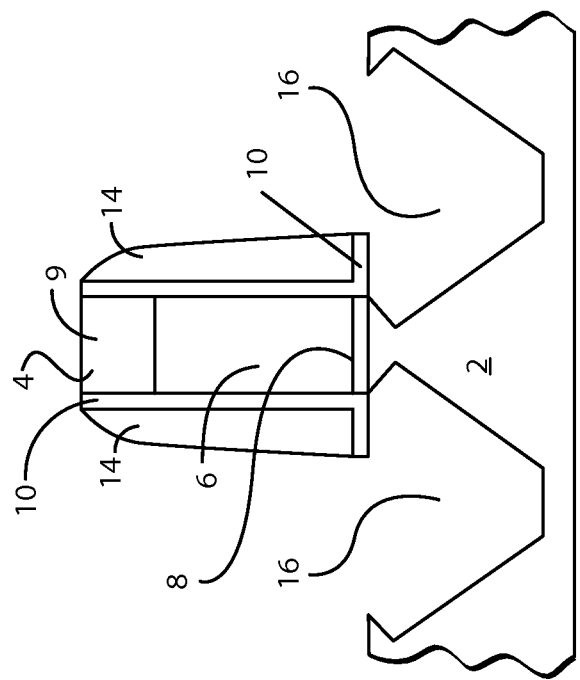
FIG. 5 is a cross-sectional view showing an intermediate structure following removal of the insertion layer under the spacer during formation of substructures in accordance with some embodiments.

FIG. 5 is a cross-sectional view of an intermediate step in the formation of an exemplary PMOS transistor embodiment after insertion layer removal 112. A portion of the insertion layer 10 below the spacer 14 can be removed, resulting in the formation of a void 20 where the insertion layer 10 was previously present (compare FIG. 4). As shown in FIG. 5, the entire insertion layer 10 below the spacer 14 can be removed in some embodiments. The insertion layer 10 can be removed using isotropic (e.g., wet) etching or other suitable techniques. In some embodiments, in order to preserve the functionality of the gate 4, the gate insulation material 8 is not removed when the insertion layer 10 is removed.

The technique used to remove the insertion layer 10 can selectively remove the material of the insertion layer 10 relative to the substrate 2, the spacer layer 14, or both. Exemplary techniques for insertion layer 10 removal include, but are not limited to, in situ dry chemical cleaning, such as Siconi™ pre-cleaning processes offered by Applied Materials, Inc., and dilute hydrofluoric acid pre-cleaning processes. The process time for the removal process can be sufficient to remove some or all of the insertion layer 10 under the spacer 14. For some Siconi™ pre-cleaning processes, the process time can be 5 to 20 seconds. For dilute hydrofluoric acid pre-cleaning processes, the process time can be 15 to 30 seconds.

Figure 7:
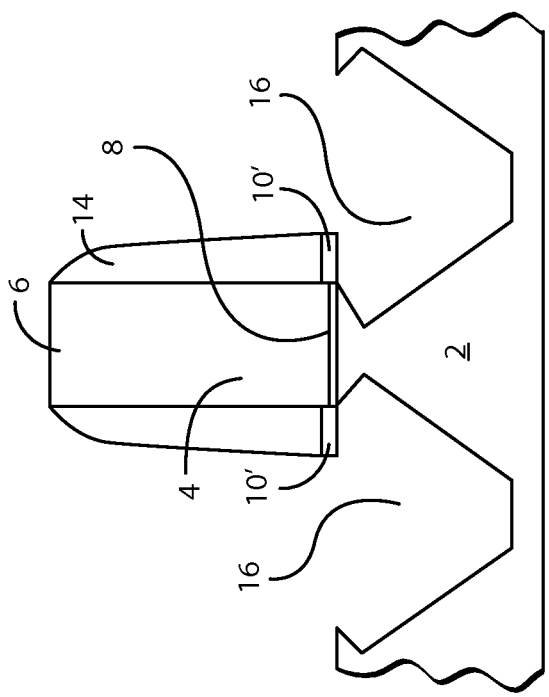
FIG. 7 is a cross-sectional view showing an embodiment with an intermediate structure similar to that of FIG. 5, where the gate structure includes a native oxide as the gate oxide and does not include an insertion layer along the side thereof.

FIGS. 6 and 7 are cross-sectional views of embodiments at the same stages as those shown in FIGS. 4 and 5, with the exception that (i) the gate insulation layer 8 layer is the native oxide 8, and (ii) the insertion layer 10' linearly covers the upper surface 12 of the substrate 2 but does not coat the sides of the gate structure 4. Such insertion layers 10, 10' can be formed using conventional deposition and etching processes. The embodiment of FIGS. 6 and 7 can be useful to control gate length where the gate structure 4 will be replaced with a high dielectric (κ) metal gate (HKMG) structure 26 following the deposition of the source/drain structure 18, as discussed below.

Figure 8:
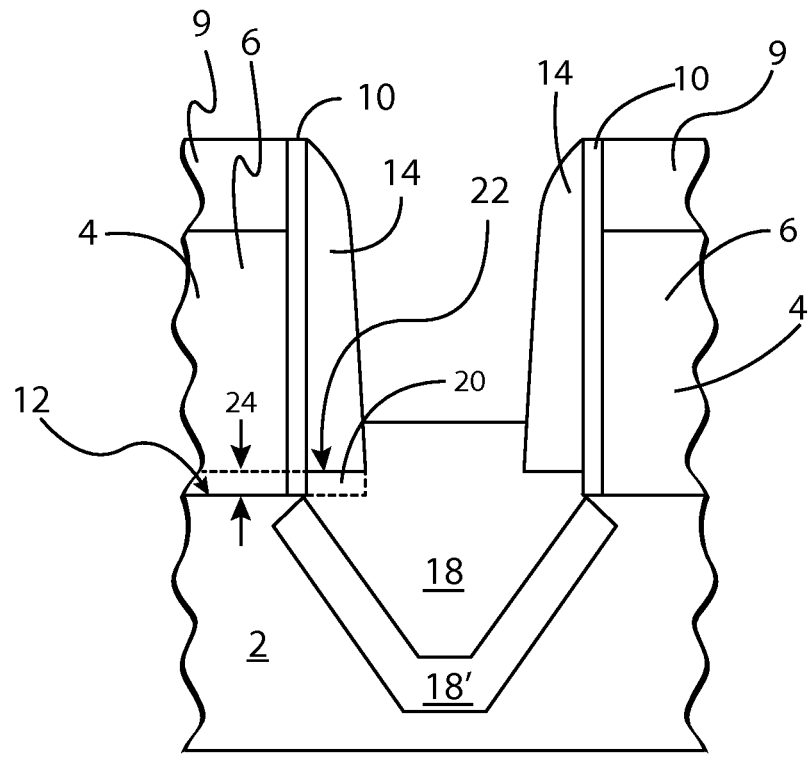
FIG. 8 is a cross-sectional view showing an embodiment with an intermediate structure following deposition of the source/drain structure during formation of the substructures described herein.

As will be understood, the structural variations of the embodiment of FIGS. 6 and 7, and the embodiment of FIGS. 4 and 5, can be independently manipulated to produce the desired end structure. For example, as shown in FIG. 8, some embodiments can include a L-shaped insertion layer 10 deposited along the sides of the gate electrode 4, but rely on a native oxide as the gate oxide layer 8 deposited between the substrate 2 and the gate electrode 6, which can be useful when replacing the poly with a HKMG structure. Alternately, some embodiments can include a gate oxide layer 8 without an L-shaped insertion layer 10 deposited along the sides of the gate electrode.

FIG. 8 is a cross-sectional view of an intermediate step in the formation of an exemplary PMOS transistor embodiment after the step of filling the recess with a strain material 114. In FIG. 8, the recess 16 has been filed with a strain material to form a source/drain structure 18. The strain material can be silicon germanium (SiGe), including doped SiGe, or another suitable material (e.g., a material with a lattice structure similar to SiGe). The strain material forming the source/drain structure 18 can be deposited by an epitaxial technique or another suitable technique. In some embodiments, an in-situ doping operation can be carried out in conjunction with the source/drain structure formation.

The source/drain structure 18 can include multiple layers with varying compositions. For example, in some embodiments, the layers most proximate the substrate 2 can have a different doping composition than those further away from the substrate 2. In addition, in some embodiments, the initial layers of the source/drain structure 18 can be formed using non-selective epitaxial techniques (e.g., cyclic deposition etch) to avoid defects, while portions further away from the substrate 2 can be formed using faster deposition techniques (e.g., selective epitaxial growth).

The source/drain structure 18 fills the recess 16 and the void 20 where the insertion layer 10 was previously located. The source/drain structure 18 and the spacer 14 can form an interface 22. The interface 22 can be located a distance 24 above the upper surface 12 of the substrate 2. In some embodiments the distance 24 is at least 1 nm, in other embodiments the distance 24 is at least 2 nm, and in still other embodiments the distance 24 is at least 3 nm. In some embodiments the distance 24 is 4 nm or less, in other embodiments the distance 24 is 3 nm or less, and in still other embodiments the distance 24 is 2 nm or less. The "distance" relates to the maximum distance from the upper surface 12 of the substrate 2 to a portion of the interface below the spacer 14 (i.e., the portion of the interface along the sides of the spacer is not considered). Although a native oxide would be present in the structure of FIG. 8, the native oxide is not shown in FIG. 8 in order to more clearly show the distance 24.

Figure 9:
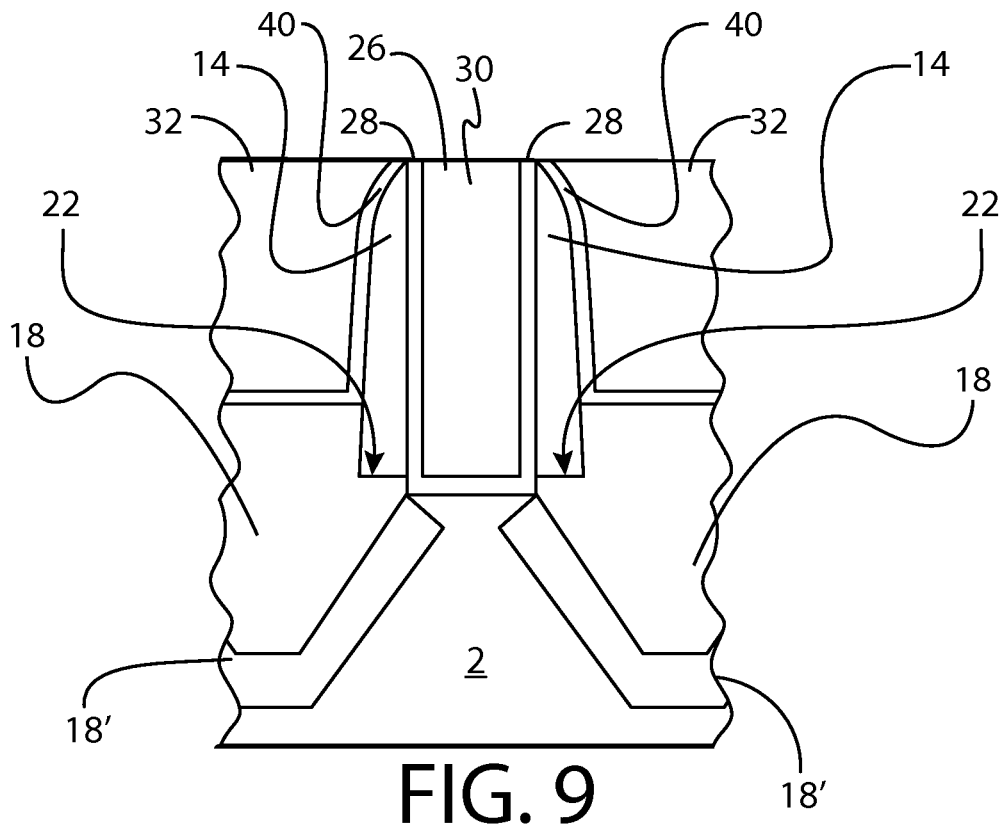
FIG. 9 is a cross-sectional view showing an embodiment such as that of FIG. 8 following replacement of the original gate structure with a high-κ metal gate and deposition of an interlayer dielectric.

FIG. 9 is a cross-sectional view of a step in the formation of an exemplary PMOS transistor embodiment where the poly gate structure 4 has been replaced with a high dielectric (κ) metal gate 26 (optional step 116). The structure of FIG. 9 can be formed by removing the poly gate structure 4 of FIG. 8 and, when present, the hard mask 9 and replacing the poly gate structure 4 with a HKMG structure 26. The poly gate structure 4 can be removed by a process or series or processes, such as etching, adapted for selective removal of the gate structure 4.

Once the poly gate structure 4 is removed, the high-κ metal gate 26 can be formed by depositing a high-κ dielectric layer 28 over the substrate 2. As shown in FIG. 9, the high K layer 28 can be a continuous layer on the inner surface of the void formed when the gate structure 4 is removed (e.g., between the spacers 14 in FIG. 9). The gate electrode 30 can then be deposited over the substrate 2 and high-κ layer 28. The high-κ layer 28 can be formed of hafnium silicate, zirconium silicate, hafnium dioxide, zirconium dioxide, combinations thereof, or another suitable material. The gate electrode 30 can be formed of tungsten nitride ($W_2N$, WN, $WN_2$), ruthenium dioxide ($RuO_2$), a combination thereof, or other suitable materials. In some embodiments, the gate electrode 30 can include multiple layers with different compositions, e.g., doping layers.

An interlayer dielectric 32 can be deposited over the source/drain structure 18 and substrate 2. The interlayer dielectric 32 can be deposited following formation of the source/drain structure 18. Where the gate structure 4 is replaced by a high-κ metal gate 26, the interlayer dielectric 32 can be deposited before the gate structure 4 is removed or after the gate structure 4 is removed. Regardless of the gate structure 4 or 26, the spacer 14 and source/drain structure 18 can be covered by a contact etch stop layer (CESL) 40. As shown in FIG. 9, the CESL layer 40 can be between the interlayer dielectric 32 and the spacer 14, the source/drain structure 18, or both.

Figure 10:
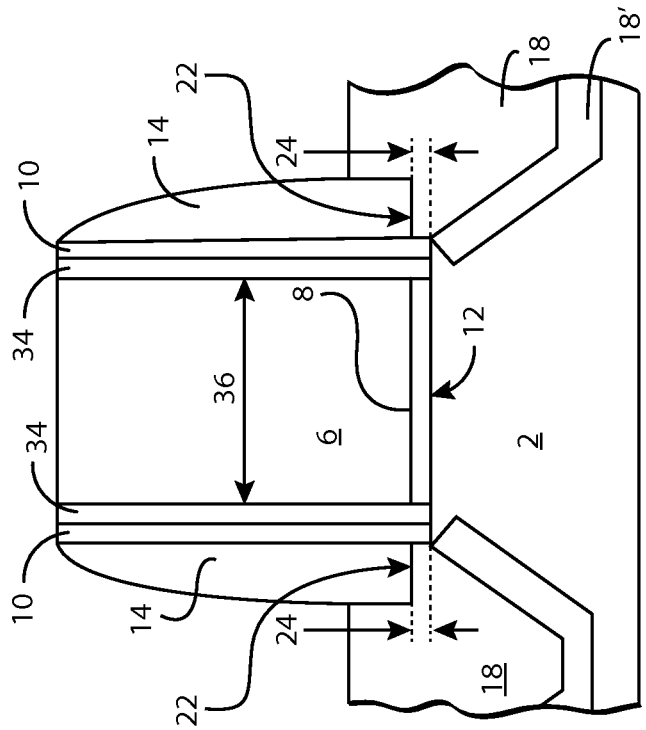
FIG. 10 is a close up of an embodiment similar to FIG. 8, with the exception that it includes a gate oxide, showing the interface between the spacer and the source/drain structure in more detail.

FIG. 10 is a cross-sectional view of an intermediate step in the formation of an exemplary PMOS transistor embodiment after the step of filling the recess with a strain material 112. FIG. 10 is a more detailed view of an embodiment similar to the structure of FIG. 8, with the exception that the embodiment of FIG. 10 includes a gate insulation layer 8 between the substrate 2 and the gate electrode 6.

Figure 11:
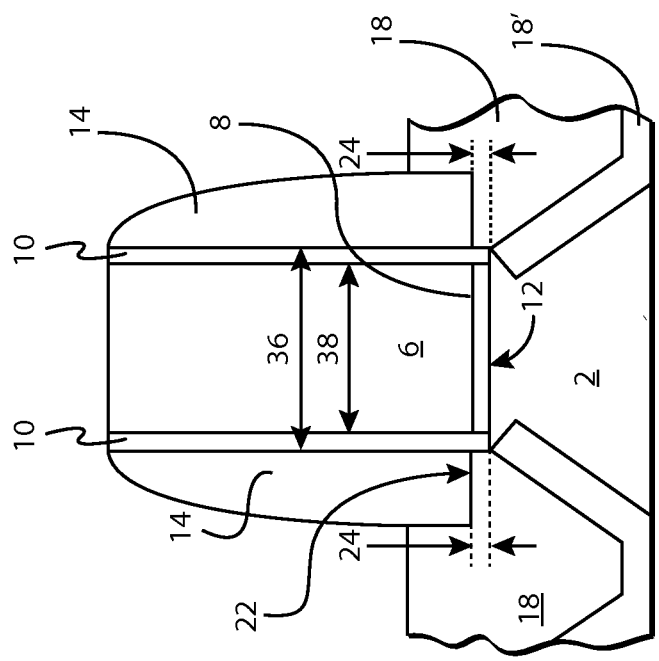
FIG. 11 is a close up of an embodiment similar to FIG. 10, with the exception that an inner spacer layer was applied to the sides of the gate structure prior to application of an L-shaped insertion layer and the spacer.

FIG. 11 is a cross-sectional view of an intermediate step in the formation of an exemplary PMOS transistor embodiment after the step of filling the recess with a strain material 112. The embodiment of FIG. 11 is similar to the structure shown in FIG. 10, with the exception that a vertical inner spacer layer 34 is deposited along the sides of the gate structure 4 prior to deposition of an L-shaped insertion layer 10. The composition of the inner spacer layer 34 can be selected so that the inner spacer layer 34 is not removed when the original gate electrode 6 and gate insulation layer 8 are removed during formation of a high-κ metal gate 26 (e.g., as part of step 116). The inner spacer layer 34 can be formed of an nitride (e.g., silicon nitride) or another suitable material. In embodiments where an inner spacer layer 34 is present, the thickness of the inner spacer layer can be less than 10 Å.

Due to the differential etchability of the inner spacer layer 34 and the gate electrode 6/gate insulation layer 8, the inclusion of the inner spacer layer 34 shown in the embodiment of FIG. 11 can be used to maintain a constant length 36 of the gate when a high-κ metal gate 26 is substituted for the original gate structure 4. In contrast, when the gate electrode 8 and the insertion layer 10 are both oxides, as in the embodiment of FIG. 10, the vertical portion of the L-shaped insertion layer 10 will be removed when the gate insulation layer 8 is removed. As a result, the length 36 of a high-κ metal gate 26 formed from the structure in FIG. 10 will be larger than the length 38 of the original gate structure 4. In some embodiments, the final length 36 of the gates 4 can range from 20 to 40 Å. In some embodiments, the thickness of the vertical component of the insertion layer 10 can be 10 to 30 Å.

Once the PMOS embodiments shown in FIGS. 8-11 have been formed, they can undergo various additional processing operations and can be coupled to various other semiconductor substructures and structures using suitable circuitry to form any of the various integrated circuits and other types of semiconductor substructures.

A complete PMOS device will include formation of a recess 16 on both sides of the gate structure (i.e., under both spacers 14). This will result in the formation of a source structure 18 to one side of the gate structure 4 and a drain structure 18 on the opposite side of the gate structure 4, both containing strain inducing material for causing compression of the channel region.

Strained layers or materials are used in semiconductor substructures because the biaxial tensile or compressive strain produced by the strain material alters carrier mobility in the layers, enabling the fabrication of high-speed devices, low-power devices or both. For example, when applied to both sides of a PMOS device, the unique source/drain structures 18 described herein with an interface rise distance, such as at least 2 nm, can improve PMOS device performance by at least 3% compared with strained PMOS devices with an interface rise distance of 0 nm. While not necessary to practice the method, and not being bound by any theory, it is believed that this results from increased strain caused by the additional volume of strain inducing material present in the source/drain material 18. This estimate of the improvement in device performance is based on technology computer added design (TOAD) simulations and actual on current (Ion) gain measurements.

In some embodiments, a semiconductor substructure is provided. The semiconductor substructure can include: a substrate, having an upper surface; a gate structure formed over the substrate; a spacer formed along a sidewall of the gate structure; and a source/drain structure disposed adjacent the gate structure, the source/drain structures formed of a strain material and disposed in an recess that extends below the upper surface of the substrate, wherein an interface between the spacer and the source-drain structure is at least 2 nm above the upper surface of the substrate. The semiconductor substructure can be a PMOS transistor.

In some embodiments, a method of forming a semiconductor substructure is provided. The method can include: providing a semiconductor substrate; forming a gate structure over the crystalline silicon material; forming a spacer along a sidewall of the gate structure; creating an recess extending into the semiconductor substrate, adjacent the gate structure; and filling the recess with a strain material, the strain material forming an interface with the spacer, wherein the interface is above an upper surface of the semiconductor substrate.

In some embodiments, a method for forming a semiconductor substructure, is provided. The method includes: providing a semiconductor substrate; forming a gate structure over the crystalline silicon material; forming an insertion layer on the semiconductor substrate; forming a spacer along a sidewall of the gate structure, wherein the spacer is formed over the insertion layer; creating at least one recess adjacent the gate structure, the recesses extending into the semiconductor substrate and extending under the spacer; removing a portion of the insertion layer under the spacer prior to the filing step; and filling the at least recess with a strain material, the strain material forming an interface with the spacer, wherein the interface is at least 2 nm above an upper surface of the semiconductor substrate.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A semiconductor substructure comprising:
a substrate;
a gate structure, wherein said gate structure is formed over said substrate;
a spacer formed adjacent to a sidewall of said gate structure; and
a source/drain structure disposed adjacent said gate structure, said source/drain structure formed of a strain material and disposed in a recess that extends below an upper surface of said substrate,
wherein a portion of said recess underlies the gate structure, and
wherein an interface between said spacer and said source-drain structure located under said spacer is above a lower surface of said gate structure.

2. The semiconductor substructure as in claim 1, wherein said semiconductor substructure comprises a PMOS transistor.

3. The semiconductor substructure as in claim 1, wherein said strain material comprises SiGe.

4. The semiconductor substructure as in claim 1, wherein said substrate comprises crystalline silicon.

5. The semiconductor substructure as in claim 1, further comprising a P-type dopant impurity region in said source-drain structure, said gate structure, or both.

6. The semiconductor substructure as in claim 1, wherein said gate structure comprises a gate electrode over a gate dielectric.

7. The semiconductor substructure as in claim 6, wherein said spacer contacts said gate electrode.

8. The semiconductor substructure as in claim 6, further comprising at least one nitride layer between said spacer and said gate electrode.

9. The semiconductor substructure as in claim 1, wherein said gate structure comprises a high dielectric ($\kappa$) metal gate (HKMG) structure.

10. The semiconductor substructure as in claim 9, wherein said spacer contacts said gate electrode.

11. The semiconductor substructure as in claim 9, further comprising at least one nitride layer between said spacer and said gate electrode.

12. A semiconductor substructure comprising:
a substrate;
a gate structure comprising a gate insulating layer over said substrate, and a gate electrode over the gate insulating layer (8);
a spacer formed adjacent to a sidewall of said gate electrode; and
a source/drain structure disposed adjacent said gate structure, said source/drain structure formed of a strain material and disposed in a recess that extends below an upper surface of said substrate,
wherein a portion of said recess underlies the gate structure, and
wherein said spacer directly contacts the source/drain structure above a lower surface of said gate insulating layer.

13. A semiconductor substructure as in claim 12, wherein the spacer directly contacts the source/drain structure at least 1 nm above said lower surface of said gate insulating layer.

14. A semiconductor substructure as in claim 12, wherein the spacer directly contacts the source/drain structure at least 2 nm above said lower surface of said gate insulating layer.

15. A method for forming a semiconductor substructure, said method comprising:

forming a gate structure over a semiconductor substrate, wherein said gate structure comprises a gate electrode over a gate insulating layer;

forming an insertion layer over said semiconductor substrate;

forming a spacer along a sidewall of said gate structure;

creating a recess extending into said semiconductor substrate, adjacent said gate structure;

removing at least a portion of said insertion layer under said spacer; and filling said recess with a strain material, said strain material directly contacting a bottom surface of the spacer above a lower surface of said gate insulating layer.

16. The method as in claim 15, wherein said creating recesses comprises anisotropic etching where said recesses extend under said spacer.

17. The method as in claim 15, wherein said insertion layer comprises an oxide and said spacer comprises a nitride.

18. The method as in claim 15, further comprising,
replacing said gate structure with a high dielectric (K), metal gate.

19. The method as in claim 15, further comprising:
forming a nitride layer along said sidewall of said gate structure prior to said step of forming said spacer.

20. The semiconductor substructure as in claim 1, wherein the portion of the recess that underlies the gate structure underlies a gate structure selected from the group consisting of a gate electrode, a gate dielectric, and a high dielectric (κ) metal gate (HKMG) structure.

\* \* \* \* \*